United States Patent [19]

Ishimaru et al.

[11] 4,438,190
[45] Mar. 20, 1984

[54] PHOTOSENSITIVE RESIN COMPOSITION CONTAINING UNSATURATED MONOMERS AND UNSATURATED PHOSPHATES

[75] Inventors: Toshiaki Ishimaru; Katsushige Tsukada; Nobuyuki Hayashi, all of Hitachi, Japan

[73] Assignee: Hitachi Chemical Company, Ltd., Tokyo, Japan

[21] Appl. No.: 351,765

[22] Filed: Feb. 24, 1982

[30] Foreign Application Priority Data

Mar. 4, 1981 [JP] Japan ................. 56-31808
Mar. 10, 1981 [JP] Japan ................. 56-34779

[51] Int. Cl.³ .............................................. G03C 1/68
[52] U.S. Cl. ............................... 430/281; 204/159.15; 204/159.16; 204/159.18; 204/159.24; 430/284; 430/905; 430/910; 430/916; 430/917; 430/919; 430/920; 430/921; 430/922
[58] Field of Search ............... 430/281, 284, 905, 910, 430/916, 917, 919, 920, 921, 922; 204/159.15, 159.16, 159.18, 159.24

[56] References Cited

U.S. PATENT DOCUMENTS

| | | | |
|---|---|---|---|
| 3,622,334 | 11/1971 | Hurley et al. | 430/281 |
| 4,269,931 | 5/1981 | Suzuki et al. | 430/281 |
| 4,272,607 | 6/1981 | Tsukada et al. | 430/285 |
| 4,289,844 | 9/1981 | Specht et al. | 430/281 |

Primary Examiner—Jack P. Brammer
Attorney, Agent, or Firm—Antonelli, Terry & Wands

[57] ABSTRACT

A photosensitive resin composition comprising (a) at least one compound selected from the group consisting of benzotriazole, benzimidazole, benzothiazole, derivatives thereof and salts thereof, (b) a phosphate compound having photopolymeric unsaturated bonds, (c), if necessary, an organic thermoplastic polymer, (d) a photopolymerizable unsaturated compound having at least one terminal ethylene group and (e) a sensitizer and/or a sensitizer system, and a photosensitive element comprising a layer of said photosensitive resin composition and a support film therefor, are provided. The photosensitive resin composition can form a protective coating film with excellent adhesiveness to the substrate surface, and such a protective coating film or, photosensitive element obtained therefrom can be advantageously used as a resist for soldering mask, etc.

14 Claims, 5 Drawing Figures

F I G. 1
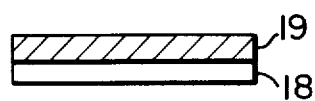
F I G. 2
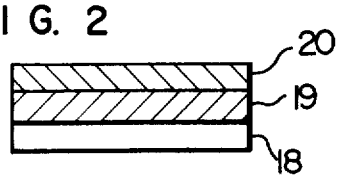
F I G. 3
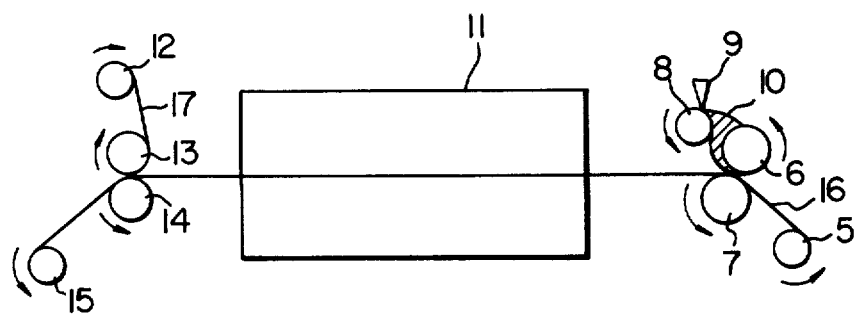

PHOTOSENSITIVE RESIN COMPOSITION CONTAINING UNSATURATED MONOMERS AND UNSATURATED PHOSPHATES

This invention relates to a photosensitive resin composition and a photosensitive element using such a composition. More particularly, it relates to a photosensitive resin composition improved in adhesiveness and usable for soldering masks (permanent protective masks), etc., such as used in production of printed wiring boards, and to a photosensitive element using such a composition.

It is well known that photosensitive resin compositions are used as photoresist in production of printed wiring boards. It is also known that photosensitive elements comprising a support film and a layer of a substantially dried photosensitive resin composition laminated thereon can be used as photoresist in producing printed wiring boards.

Photosensitive resin compositions or photosensitive elements used for producing printed wiring boards may be roughly divided into the following two types according to the purposes of use. One is the type used for forming a wiring pattern which forms a resist image in etching or metal plating and the other is the type used for forming a soldering mask.

Either of these types is required to have adhesiveness to the substrate employed, but the significance of such adhesiveness differs greatly from one type to the other. That is, adhesiveness required in the former type is such as to merely inhibit penetration of the etching or plating solution having a temperature ranging from room temperature to 100° C. at highest only during the etching or plating operation while allowing easy and perfect separation of the resist from the substrate after the etching or plating treatment. In other words, adhesiveness required in this type is of merely a temporary nature.

On the other hand, adhesiveness in the latter type is a permanent one and the adhesiveness is required to be strong enough to prevent penetrating of the solder or floating of the mask during immersion in a soldering bath of a high temperature (usually 240° to 300° C.).

Concerning the former type, there is proposed in U.S. Pat. No. 3,622,334 improvement of etching and plating resistance by addition of benzimidazole, 2-aminobenzothiazole, benzotriazole or derivatives thereof.

However, the effect of such additives in the case of the latter type is not known, and the results of the experiments conducted by the present inventors showed total ineffectiveness of said additives for the latter type of the photosensitive resin compositions. This is considered due to the fact that adhesiveness required in the latter type is of different nature from plating resistance, etc., and is quite a "strict" one as heretofore described.

U.S. Pat. No. 4,272,607 discloses phosphorus-containing acrylic acid derivatives as examples of the photopolymerizable unsaturated compounds constituting the photosensitive resin compositions, but there is given no suggestion as to the effect thereof on soldering heat resistance, and also the experiments by the present inventors clarified that almost no effect is produced by single use of such compounds.

As a result of extensive studies on these photosensitive resin compostions, the present inventors found that soldering heat resistance is surprisingly improved when a phosphate compound having photopolymerizable unsaturated bonds is used in combination with such a substance as benzotriazole, benzimidazole, benzothiazole, etc., and the present invention was attained on the basis of such finding.

An object of this invention is to provide a photosensitive resin composition improved in adhesiveness to the substrate and usable for forming soldering masks, etc., and a photosensitive element using such a composition.

Thus, the present invention provides a photosensitive resin composition comprising:
(a) at least one compound selected from the group consisting of benzotriazole, benzimidazole, benzothiazole, derivatives thereof and salts thereof,
(b) a phosphate compound having photopolymerizable unsaturated bonds,
(c) if necessary, an organic thermoplastic polymer,
(d) a photopolymerizable unsaturated compound having at least one terminal ethylene group, and
(e) a sensitizer and/or a sensitizer system capable of initiating polymerization of said unsaturated compounds (b) and (d) upon irradiation of actinic light.

The present invention also provides a photosensitive element comprising a layer of a photosensitive resin composition and a support film therefor, said photosensitive resin composition containing (a) at least one compound selected from the group consisting of benzotriazole, benzimidazole, benzothiazole, derivatives thereof and salts thereof, (b) a phosphate compound having photopolymerizable unsaturated bonds, (c) an organic thermoplastic polymer, (d) a photopolymerizable compound having at least one terminal ethylene group, and (e) a sensitizer and/or a sensitizer system capable of initiating polymerization of said unsaturated compounds (b) and (d) upon irradiation of actinic light.

In the accompanying drwings,

FIGS. 1 and 2 are sectional views showing examples of the photosensitive elements according to this invention;

FIG. 3 is a schematic drawing of an apparatus for producing the photosensitive elements used in the Examples described later;

Figure 4:
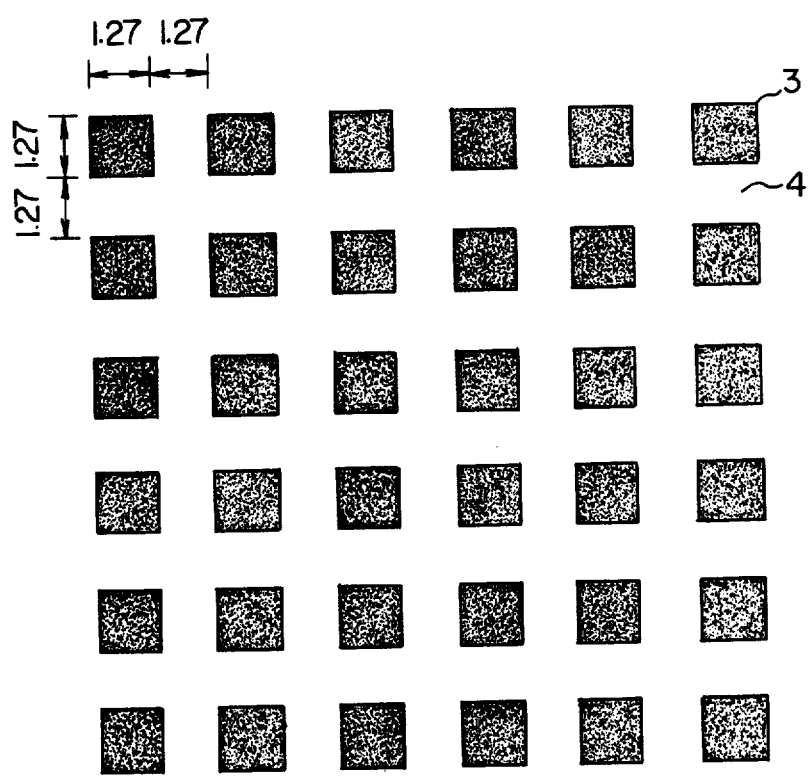
FIG. 4 is a drawing showing a negative mask for testing used in the Examples.

The photosensitive resin composition and the photosensitive element according to the present invention are described in detail hereinafter.

Description is first made on the respective components of the photosensitive resin composition of this invention. As the component (a) of the composition, there is selected at least one compound chosen from the group consisting of benzotriazole, benzimidazole, benzothiazole, derivatives thereof and salts thereof. The term "derivatives thereof" as used herein means those compounds in which a hydrogen atom or atoms are substituted with at least one alkyl group, aryl group, nitro group, halogen, amino group, hydroxyl group, carboxyl group or the like or those in which the benzene ring has been substituted by a naphthalene ring. The term "salts thereof" means acid salts, such as hydrochlorides, acetates, etc., of said compounds, amine salts, etc.

Preferred examples of these compounds are benzotriazole, benzotriazole hydrochloride, 1-chlorobenzotriazole, hydroxybenzotriazole, naphthotriazole, methylbenzotriazole and amine salts, etc., thereof; benzimidazole, benzimidazole hydrochloride, 2-aminobenzimidazole, 2-methylbenzimidazole, 5-nitrobenzimidazole, 5-methylbenzimidazole, etc.; and 2- aminobenzothiazole, 2-aminobenzothiazole hydrochloride, etc. Among these salts, hydrochlorides are preferred because of their easiness of preparation. A noticeable effect of addition of these compounds can be obtained from the compound content of about 0.001% by weight or more in the photosensitive resin composition, but preferably said compound is added in an amount of 0.01 to 3% by weight in the photosensitive resin composition.

Preferred examples of the phosphate compounds having photopolymerizable unsaturated bonds used as component (b) of the composition include PHOSMER-M (a trade name of an acid phosphoxyethyl methacrylate, manufactured by Yushi Seihin Co., Ltd.), PHOSMER-CL (3-chloro-2-acid phosphoxypropyl methacrylate), PM-2 (bis(methacryloxyethyl)phosphate), PA-1 (acryloxyethylphosphate) and PA-2 (bis(acryloxyethyl)phosphate) in KAYAMER ® series manufactured by Nippon Kayaku Co., Ltd., and VINYATE-R (bis(2-chloro-ethyl)-vinyl phosphate) and PS-A4 (1,2-bis(carboxyallyl)-ethyl-dibutyl phosphate) manufactured by Daihachi Chemical Industry. These compounds exhibit their effect when they are added in an amount of about 0.001% by weight or more in the photosensitive resin composition, but it is usually preferred to use such compounds in an amount of 0.01 to 10% by weight in the composition.

The component (c), or an organic thermoplastic polymer, is added at need, but in case of forming a photosensitive element, such polymer is an essential component for giving the film properties to the resin composition. Employable as such organic thermoplastic polymer are those disclosed in U.S. Pat. No. 3,261,686. For example, there may be used polyamides such as alcohol-soluble nylon, vinyl polymers such as poly(methyl methacrylate), vinyl copolymers such as methyl methacrylate/acrylic acid/styrene copolymer, celluloses such as cellulose acetate, and polyesters such as butanediol-/isophthalic acid/sebacic acid condensation polymer. Among them, linear vinyl copolymers are preferred because of their compatibility with other components and good adhesiveness to the substrate surface. Various types of vinyl monomers may be used as the copolymerization component of these polymers. As typical examples of such vinyl monomers, there may be cited methyl methacrylate, butyl methacrylate, ethyl acrylate, styrene, α-methylstyrene, vinyltoluene, 2-hydroxyethyl methacrylate, 2-hydroxypropyl acrylate, acrylic acid, methacrylic acid, glycidyl methacrylate, t-butylaminoethyl methacrylate, 2,3-dibromopropyl methacrylate, 3-chloro-2-hydroxypropyl methacrylate, tetrahydrofurfuryl methacrylate, tribromophenyl acrylate, acrylamide, acrylonitrile, butadiene, etc. The content of such organic thermoplastic polymer in the photosensitive resin composition is preferably in the range of 20 to 80 parts by weight for the reason of maintaining the film properties and photosetting property of the composition.

Used as the component (d) of the photosensitive resin composition of this invention is a photopolymerizable unsaturated compound having at least one terminal ethylene group. As examples of such compounds, there may be cited the photopolymerizable compounds disclosed in Japanese Patent Appln Kokoku (Post-Exam Publn) No. 37214/78, the monomers disclosed in U.S. Pat. No. 3,632,636, and photopolymerizable urethane di(meth)acrylate (i.e., diacrylate or dimethacrylate) compounds. Typical examples of the photopolymerizable unsaturated compounds usable in this invention are trimethylolpropane triacrylate, trimethylolpropane trimethacrylate, pentaerythritol triacrylate, ethylene glycol diacrylate, diethylene glycol diacrylate, 2,2-di(p-hydroxyphenyl)-propane diacrylate, di-(3-acryloxy-2-hydroxypropyl)ester of tetrabromobisphenol A, etc.

The urethane di(meth)acrylate compounds can be obtained by reacting (i) at least one diisocyanate compound selected from isophorone diisocyanate and trimethylhexamethylene diisocyanate, (ii) a dihydric alcohol and (iii) a (meth)acrylic (i.e., acrylic or methacrylic) monoester of a dihydric alcohol.

As the diisocyanate compound (i), there may be used isophorone diisocyanate (IPDI) manufactured by, for example, Veba Chemie Co., Ltd. (West Germany), and trimethylhexamethylene diisocyanate (TMDI), which is a mixture of 2,2,4-trimethylhexamethylene diisocyanate and 2,4,4-trimethylhexamethylene diisocyanate. IPDI and TMDI can be used alone or as a mixture thereof.

As the dihydric alcohol of (ii) and that in (iii), there can be used ethylene glycol, diethylene glycol, triethylene glycol, tetraethylene glycol, propylene glycol, dipropylene glycol, 1,4-butanediol, 1,3-butanediol, 2,3-butanediol, 1,5-pentanediol, 1,6-hexanediol, 1,10-decanediol, neopentyl glycol, 1,4-cyclohexane dimethanol, bis(2-hydroxyethyl)terephthalate, 2,2-bis(4-hydroxyethoxyphenyl)propane, 2,2-bis(4-hydroxydiethoxyphenyl)propane, and the like.

As the (meth)acrylic monoester of a dihydric alcohol, there can be used 2-hydroxyethyl (meth)acrylate, 2-hydroxypropyl (meth)acrylate, 1,4-butanediol mono(meth)acrylate, 1,3-butanediol mono(meth)acrylate, and the like.

The dihydric alcohol of (ii) and that in (iii) may be the same or different. The obtained urethane di(meth)acrylate can be represented by the following formula:

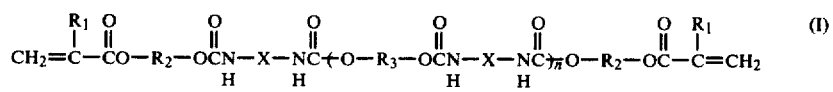

In the formula (I), $R_1$ is H or $CH_3$; $R_2$ is a residue of a dihydric alcohol; $R_3$ is a residue of a dihydric alcohol; X is a residue of isophorone diisocyanate or a trimethylhexamethylene group; and n is zero or an integer preferably from 1 to 3. The actually obtained reaction product is a mixture of urethane di(meth)acrylate compounds in which the values of n are different.

When the urethane di(meth)acrylate compound is synthesized, the reaction is usually effected to a temperature from 40° to 100° C., and it is preferable to determine the amounts of the isocyanate compound (i), the dihydric alcohol (ii) and the (meth)acrylic monoester of a dihydric alcohol (iii), so as to effect the reaction so that the isocyanate equivalent of the diisocyanate compound (i) may be almost equal to the alcohol equivalent of the sum of the dihydric alcohol (ii) and the (meth)acrylic monoester of a dihydric alcohol (iii). However, the isocyanate equivalent may be a little over or a little below the alcohol equivalent. When the isocyanate equivalent is a little over the alcohol equivalent, the excess isocyanate groups are finally reacted with a monohydric alcohol such as methanol, whereby the free isocyanate groups can be eliminated.

When the ratio of the alcohol equivalent of the dihydric alcohol (ii) to be reacted to the alcohol equivalent of the (meth)acrylic monoester of a dihydric alcohol (iii) is adjusted to 1 (provided that the isocyanate equivalent of the diisocyanate compound to be reacted is made almost equal to the total alcohol equivalent), the numerical average value of n becomes 1.

These compounds were cited merely by way of exemplification and not in a restrictive sense. The content of such photopolymerizable unsaturated compound having at least one terminal ethylene group in the photosensitive resin composition of this invention is preferably within the range of 20 to 80 parts by weight for the reason of film properties and photosetting properties.

Used as component (e) of the photosensitive resin composition of this invention is a sensitizer and/or a sensitizer system which initiates polymerization of said unsaturated compounds (b) and (d) upon irradiation of actinic light. Examples of the sensitizers usable in this invention are substituted or unsubstituted polynuclear quinones such as 2-ethylanthraquinone, 2-t-butylanthraquinone, octamethylanthraquinone, 1,2-benzanthraquinone, 2,3-diphenylanthraquinone, etc.; ketoaldonyl compounds such as diacetyl, benzyl, etc.; α-ketoaldonyl alcohols and ethers such as benzoin, pivalone, etc.; α-hydrocarbon-substituted aromatic acyloins such as α-phenyl-benzoin, α,α-diethoxyacetophenone, etc.; and aromatic ketones such as benzophenone, 4,4'-bis-dialkylaminobenzophenone, etc. These sensitizers may be used either singly or in combination.

Ther term "sensitizer system" is used herein to mean a combination of a sensitizer and a sensitizing assistant. Examples of such sensitizer system are combinations of 2,4,5-triarylimidazole dimer and 2-mercaptobenzoquinazole, leucocrystal violet, tris(4-diethylamino-2-methylphenyl)methane and the like. It is possible to use such type of additives which, although having no photoinitiating property per se, can provide a sensitizer system with even better photoinitiating performance as a whole when used in combination with above-said materials. Typical examples of such additives are tertiary amines such as triethanolamine when used in combination with benzophenone. Such sensitizer and/or sensitizer system is preferably contained in an amount of 0.5 to 10% by weight in the photosensitive resin composition.

The photosensitive resin composition according to this invention may also contain one or more other secondary components such as, for example, thermal polymerization inhibitors, dyes, pigments, fillers, dispersion stabilizers, coating property improvers, flame retardants, flame-retardant assistants, etc. These additives may be properly selected in the same way as used with the ordinary photosensitive resin compositions.

Now, the ways of use of the photosensitive resin composition of this invention are described by way of examples thereof.

Formation of a layer of the photosensitive resin composition of this invention on a substrate may be accomplished in a usual way. For example, such layer may be formed by uniformly dissolving the photosensitive resin composition in an organic solvent such as methyl ethyl ketone, toluene, methylene chloride, etc. (with the filler, pigment, etc., being uniformly dispersed), then directly applying this solution on the substrate by dip coating, flow coating or other means and then drying the solvent. Thereafter, said layer is exposed imagewise to a light source such as an ultra-high pressure mercury arc lamp through a negative mask, either directly or after further providing on said photosensitive resin layer an oxygen-impermeable protective layer such as shown in Japanese Patent Appln Kokoku (Post-Exam Publn) Nos. 35687/71 and 32714/71 or laminating a film pervious to actinic light such as a polyester film. In case a polyester film or such is laminated, development is conducted after removing such film. As the developing solution, there may be used an organic solvent such as 1,1,1-trichloroethane, an alkaline aqueous solution, an aqueous solution of an organic solvent and the like.

The development is followed by a heat treatment at a temperature of 80° to 200° C. and exposure to actinic light, whereby a soldering mask with excellent properties can be obtained. As for the order of said heat treatment and exposure to actinic light to be performed after development, either of them may come first, and also each of these treatments may be conducted in several stages. The protective coating film obtained as a result of such heat treatment and exposure to actinic light after development shows excellent soldering heat resistance. Also, this protective film is well resistant to the organic solvents such as trichloroethylene, isopropyl alcohol, toluene, etc., as well as to the acidic and alkaline solutions, so that it can be used as a permanent protective film for soldering masks, etc.

Further, the photosensitive resin composition of this invention may be printed imagewisely on a substrate by silk screen printing and then photoset by using a light source such as a high pressure mercury arc lamp to form an image-patterned protective coating film. The thus obtained protective coating film also has excellent adhesiveness to the substrate surface.

The photosensitive element according to this invention has a structure such as illustrated in FIG. 1 of the accompanying draings, and such an element can be obtained by forming a layer 19 of said photosensitive resin composition on a support film 18 in the substantially same way as the above-described operations. Formation of the photosensitive resin composition layer on the support film can be accomplished in a usual way. For instance, the photosensitive resin composition is uniformly dissolved in an organic solvent such as methyl ethyl ketone, toluene, methylene chloride, etc. (with pigments, etc., being uniformly dispersed) and this solution is applied on the support film by suitable means such as knife coating, roll coating, etc., and dried. It is desirable that the amount of the residual solvent in the photosensitive layer is kept 2% by weight or less, most preferably 1% by weight or less, for maintaining the properties of the composition.

The support film used in this invention may be either pervious or impervious to actinic light. Preferred examples of such support film are polyester film, polyimide film, polystyrene film and other like known films.

In case of producing a long photosensitive element, said element is wound up into a roll in the final stage of production. In this case, it is possible to prevent the photosensitive resin composition layer in the rolled element from adhering to the back side of the support film by using a support film whose back side has been properly treated by a method known in the art of production of pressure-sensitive adhesive tapes. It is also desirable to laminate a strippable cover film 20 on the photosensitive resin composition layer 19 of said element for the same purpose and/or other purposes such as prevention of deposition of dust.

Examples of such strippable cover film are polyethylene film, polypropylene film, Teflon film, surface-treated paper and the like, but such cover film should be one whose adhesive force to the photosensitive resin composition layer proves to be smaller than the adhesive force between the photosensitive resin composition layer and the support film when said cover film is stripped off.

Now, the applications of the photosensitive element according to this invention are illustrated by way of the following Examples.

Lamination of the photosensitive element of this invention on a substrate is easy. When no cover film is provided, said element can be immediately laminated on the substrate by heating it under pressure, and when a cover film is provided, said element is similarly laminated after or while stripping off the cover film. Such heat-and-pressure lamination can be accomplished by using a normal-pressure laminator well known to the printed wiring board manufactures. In case the substrate is of the type which has unevenness of more than 10 μm as in a printed wiring board formed with conductor wiring lines, it is preferred to perform said lamination under reduced pressure or in vacuo. As means for effectuating such lamination, there may be used, for example, the laminators disclosed in Japanese Patent Appln Kokai (Laid-Open) No. 52703/77 and U.S. Pat. No. 4,127,436.

Exposure and development after lamination can be performed in a usual way. For instance, in case the support film is impervious to actinic light, such support film is first stripped off and then the laminate is exposed imagewisely through a negative mask by using a light source such as a high pressure mercury arc lamp or an ultra-high pressure mercury arc lamp.

In case the support film still remains after exposure, such remaining support film is removed and then development is conducted. An organic solvent such as 1,1,1-trichloroethane, an alkaline aqueous solution, an aqueous solution of an organic solvent and the like may be used as the developing solution.

An additional heat treatment at 80° to 200° C. and further exposure to actinic light provide a soldering mask with excellent properties. Either of such post-development heat treatment and exposure to actinic light may be conducted ahead of the other, and also each of such treatments may be performed in several stages. The protective film obtained by such post-development heat treatment and exposure to actinic light exhibits excellent soldering heat resistance. Further, such protective film is well resistant to organic solvents such as trichloroethylene, isopropyl alcohol, toluene, etc., as well as to the acidic and alkaline aqueous solutions, so that it can be advantageously used as a permanent protective film for soldering masks, etc.

The present invention is further described hereinbelow by way of the following Examples and Comparative Examples, wherein all "parts" and "percents" are by weight unless otherwise specified.

EXAMPLE 1

| (a) Synthesis of a photopolymerizable compound having a terminal ethylene group | | |
|---|---|---|
| Materials | | |
| A | Trimethylhexamethylene diisocyanate | 1155 parts (11 equivalents) |
| | Isophorone diisocyanate | 555 parts (5 equivalents) |
| | Toluene | 1200 parts |
| | Di-n-butyltin dilaurate | 1 part |
| B | 2-Hydroxyethyl acrylate | 1624 parts (14 equivalents) |
| | 1,4-Butanediol | 90 parts (2 equivalents) |
| | Toluene | 300 parts |
| | p-Methoxyphenol | 0.3 part |
| C | Methanol | 20 parts |

Said material A was placed in an approximately 5-liter-capacity heatable and coolable reactor equipped with a thermometer, a stirrer, a cooling pipe, a nitrogen gas feed pipe and a dropper, and said material A was heated to 60° C. under stirring. Then material B was added dropwise uniformly into said material A in the reactor over a period of about 5 hours while maintaining the reaction temperature at 55°–65° C. After addition of B, the reaction temperature was raised gradually to 80° C. over a period of about 5 hours. Thereafter, the temperature was lowered to 60° C. and material C was added, followed by about one-hour stirring of the mixture. Then the reaction mixture was dried under reduced pressure to remove the solvent, thereby obtaining a viscous photopolymerizable compound (I) having a terminal ethylene group.

| (b) Production of photosensitive element | |
|---|---|
| Materials | |
| Photopolymerizable compound (I) obtained by the above-said method | 40 parts |
| A-TMPT (a polyvalent acrylate manufactured by Shin-Nakamura Kagaku K.K.) | 10 parts |
| Methyl methacrylate/methyl acrylate/acrylic acid/acrylonitrile (83/10/2/5 by weight) copolymer (molecular weight: about 120,000) | 50 parts |
| Benzophenone | 2.7 parts |
| Michler's ketone | 0.3 part |
| p-Methoxyphenol | 0.02 part |
| Victoria pure blue | 0.05 part |
| Toluene | 50 parts |
| Methyl ethyl ketone | 50 parts |

Hydroxybenzotriazole and PHOSMER-M (a trade name of a phosphate compound containing a methacryl group, manufactured by Yushi Seihin Co., Ltd.) were added in amounts shown in Table 1 to 20 parts of the blend of the above-shown materials to prepare 10 types (specimens) of solutions of photosensitive resin composition.

TABLE 1

| Run No. | Amount of hydroxybenzotriazole added (part) | Amount of PHOSMER-M added (part) |
|---|---|---|
| EX-1 | 0 | 0 |
| EX-2 | 0.005 | 0 |
| EX-3 | 0.020 | 0 |
| EX-4 | 0.100 | 0 |

TABLE 1-continued

| Run No. | Amount of hydroxy-benzotriazole added (part) | Amount of PHOSMER-M added (part) |
|---|---|---|
| EX-5 | 0 | 0.005 |
| EX-6 | 0 | 0.020 |
| EX-7 | 0 | 0.100 |
| EX-8 | 0.003 | 0.020 |
| EX-9 | 0.010 | 0.010 |
| EX-10 | 0.010 | 0.005 |

(Note)
Figures are added amounts in part to 20 parts of the blend of the above-shown composition.

By using the apparatus shown in FIG. 3, each of said ten types of photosensitive resin composition solutions 10 was applied uniformly on a 25 μm thick polyethylene terephthalate film 16 and dried by passing it through a 80°-100° C. hot air convection dryer 11 for about 10 minutes. The thickness of the photosensitive resin composition layer after drying was about 75 μm. An about 25 μm thick polyethylene film 17 was pasted on the photosensitive resin composition layer as a cover film as shown in FIG. 3.

In FIG. 3, reference numeral 5 indicates a polyethylene terephthalate film delivering roll, 6, 7 and 8 rolls, 9 a knife, 12 a polyethylene film delivering roll, 13 and 14 rolls, and 15 a photosensitive element take-up roll.

(c) Formation of soldering mask

Each of the 10 specimens of photosensitive element obtained in (b) above was laminated on a copper-clad laminate (MCL-E 61 mfd. by Hitachi Chemical Co., Ltd., copper foil thickness: 35 μm, substrate thcikness: 1.6 mm) with its copper surface cleaned by a pretreatment while stripping off the cover film by using laminator A-500 mfd. by Akebono Industry Co., Ltd. After lamination, the laminate was irradiated with ultraviolet rays at an exposure rate of 150 mJ/cm² through a negative mask for test shown in FIG. 4 by using an exposing machine PHENIX-3000 mfd. by ORC Factory Co., Ltd. In FIG. 4, numeral 3 indicates the opaque portion of the negative mask and 4 the transparent portion. The unit of the figures is mm.

After standing at room temperature for 30 minutes, the support film was stripped off and the laminate was subjected to spray development at 20° C. for 120 seconds by using 1,1,1-trichloroethane. After development, the laminate was dried with heating at 80° C. for 10 minutes, then further subjected to a 30-minute heat treatment at 150° C. and then irradiated with ultraviolet rays for an exposure of 5 J/cm² by using an ultraviolet irradiator manufactured by Toshiba Denzai Co., Ltd.

The thus obtained ten test substrates formed with a protective coating film were then subjected to a soldering test by contacting them with a 255°-265° C. flow soldering bath for 30 seconds by using a rosin type flux A-226 (manufactured by Tamura Kaken Co., Ltd.). The results are shown collectively in Table 2.

TABLE 2

| Run No. | Condition of protective film |
|---|---|
| EX-1 | Poor as floating and peel-off occurred |
| EX-2 | " |
| EX-3 | " |
| EX-4 | " |
| EX-5 | " |
| EX-6 | " |
| EX-7 | " |
| EX-8 | Good |

TABLE 2-continued

| Run No. | Condition of protective film |
|---|---|
| EX-9 | Good |
| EX-10 | Good |

As is clear from Table 2, only the protective films formed from the photosensitive element specimens containing both hydroxybenzotriazole and PHOSMER-M (EX-8, EX-9 and EX-10) showed excellent soldering heat resistance, while the protective films formed from other specimens, that is, the specimen containing neither hydroxybenzotriazole nor PHOSMER-M (EX-1), the specimens containing hydroxybenzotriazole but not containing PHOSMER-M (EX-2, EX-3 and EX-4) and the specimens containing PHOSMER-M but not containing hydroxybenzotriazole (EX-5, EX-6 and EX-7), suffered from excessive floating or peel-off in said soldering test and also soldering penetrate was seen in these protective films.

EXAMPLE 2

| Materials | |
|---|---|
| Photopolymerizable compound (I) having a terminal ethylene group synthesized in Example 1-(a) | 40 parts |
| ARONIX M-6100 (a tradename of a polyvalent acrylate manufactured by Toagosei Chemical Industry Co., Ltd.) | 12 parts |
| Methyl methacrylate/ethyl acrylate/tetrahydrofurfuryl methacrylate/tribromophenyl acrylate (60/4/10/26 by weight) copolymer (M.W. about 100,000) | 48 parts |
| Benzophenone | 4 parts |
| Michler's ketone | 0.2 part |
| Benzimidazole | 0.1 part |
| KAYAMER-PA2 (a tradename for a phosphate compound containing an acryl group mfd. by Nippon Kayaku Co., Ltd.) | 0.2 part |
| Phthalocyanine Green SAX (a tradename for a pigment manufactured by Sanyo Shikiso K.K.) | 0.3 part |
| Anthimony trioxide | 1 part |
| Methyl ethyl ketone | 10 parts |
| Toluene | 50 parts |

Figure 5:
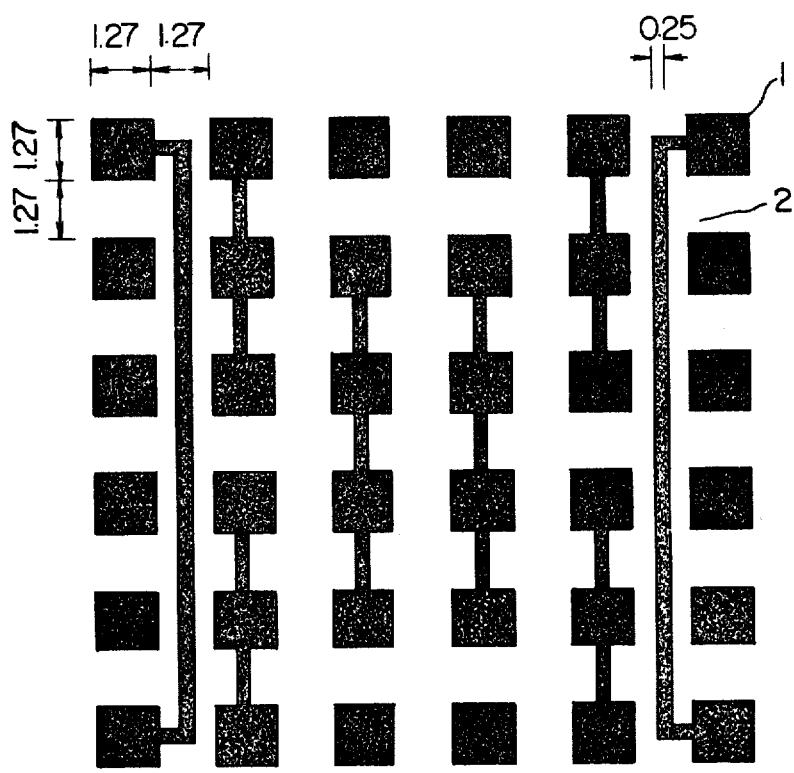
FIG. 5 is a drawing showing a copper pattern on the test substrate used in the Examples.

A printed wiring board for test (with a glass epoxy substrate having a thickness of 1.6 mm) formed with a copper pattern (approximately 50 μm thick) shown in FIG. 5 was immersed in a solution of the photosensitive resin composition consisting of the above-shown materials and then dried at 80° C. for 20 minutes to form on the surface of said printed wiring board a layer of the photosensitive resin composition with a thickness after drying of about 60 μm. In FIG. 5, numeral 1 designates the copper pattern portion and 2 the exposed portion of the substrate, and the unit of the figures is mm. On the photosensitive resin composition layer was further laminated an approximately 25 μm thick polyethylene terephthalate film. The laminate was then exposed to ultraviolet rays at a rate of 120 mJ/cm² through a testing negative mask shown in FIG. 4. After allowing the laminate to stand at room temperature for 30 minutes, the polyethylene terephthalate film was stripped off, followed by 120-second spray development with 1,1,1-trichloroethane. After development, the laminate was dried under heating at 80° C. for 10 minutes and the irradiated with ultraviolet rays for an exposure of 3 J/cm², which was further followed by a 30-minute heat treatment at 160° C. The thus obtained test substrate formed with a protective film was subjected to the soldering test by contacting it for 15 seconds with a 255°-265° C. flow soldering bath by using a rosin type flux MH-320V (mfd. by Tamura Kaken Co., Ltd.). This substrate remained free of floating and peel-off of the protective film and showed excellent soldering heat resistance.

COMPARATIVE EXAMPLE 1

In the same way as Example 2 except for non-use of KAYAMER-PA2, a photosensitive element was produced, then an imagewise protective film was formed on the test substrate and the element was subjected to the soldering test. Floating and blistering were admitted in the protective film and also solder penetrating occured.

EXAMPLE 3

| Materials | |
|---|---|
| ARONIX M-8060 (polyvalent acrylate mfd. by Toagosei Chemical Industry Co., Ltd.) | 15 parts |
| AECHPP (a tradename of a monovalent acrylate mfd. by Osaka Yuki K.K.) | 5 parts |
| A-TMM-3L (a tradename of a polyvalent acrylate mfd. by Shin-Nakamura Kagaku K.K.) | 30 parts |
| Methyl methacrylate/methyl acrylate/methacrylic acid/tribromophenyl acrylate (70/10/10/10 by weight) copolymer (MW. approx. 70,000) | 50 parts |
| Benzophenone | 4 parts |
| Michler's ketone | 0.2 part |
| Benzotriazole hydrochloride | 0.05 part |
| PHOSMER-CL (a phosphate compound containing a methacryl group, mfd. by Yushi Seihin Co., Ltd.) | 0.1 part |
| Victoria Pure Blue | 0.01 part |
| Phthalocyanine Green SAX | 0.2 part |
| Antimony trioxide | 2 parts |
| Ethyl cellosolve | 40 parts |
| Methyl ethyl ketone | 30 parts |

A solution of the photosensitive resin composition of the above-shown recipe was applied on a testing printed wiring board (with a glass epoxy substrate having a thickness of 1.2 mm) formed with a copper pattern (with a copper thickness of about 35 μm) shown in FIG. 5 and then dried at 90° C. for 15 minutes. The thickness of the photosensitive resin composition layer after drying was about 50 μm.

Then this photosensitive resin composition layer was further coated with a 3% aqueous solution of polyvinyl alcohol (saponification degree: 99%) containing 2% of a polyoxyethylene surfactant of the formula:

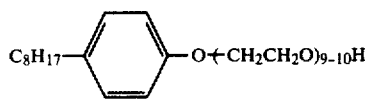

and dried at 105° C. for 5 minutes. The post-drying thickness of the polyvinyl alcohol coating was about 1 μm.

This was then irradiated with ultraviolet rays at an exposure of 180 mJ/cm² through a testing negative mask shown in FIG. 4, allowed to stand at room temperature for 30 minutes and then subjected to 120-second spray development with a developing solution of the composition shown below to thereby remove the polyvinyl alcohol coating and the unexposed portion of the photosensitive layer. After washing with water, the resulting substrate was dried under heating at 80° C. for 15 minutes, then irradiated with ultraviolet rays at an exposure rate of 3 J/cm² and further subjected to a 30-minute heat treatment at 160° C.

The thus obtained test substrate with a protective film was subjected to the soldering test by contacting it for 15 seconds with a 255°-265° C. flow soldering bath by using a water-soluble flux WS-37 (mfd. by Tamura Kaken Co., Ltd.). This substrate suffered no floating nor peel-off of the protective film and showed good soldering heat resistance.

EXAMPLE 4

| (a) Synthesis of a photopolymerizable compound having a terminal ethylene group | | |
|---|---|---|
| | Materials | |
| A | Trimethylhexamethylene diisocyanate | 1680 parts (16 equivalents) |
| | Toluene | 1200 parts |
| | Di-n-butyltin dilaurate | 1 part |
| B | 2-Hydroxyethyl acrylate | 1856 parts (16 equivalents) |
| | Toluene | 300 parts |
| | p-Methoxyphenol | 0.3 part |
| C | Methanol | 20 parts |

By using the above-shown materials, there was prepared a viscous photopolymerizable compound (II) having a terminal ethylene group in the same way as Example 1.

| (b) Production of photosensitive elements and formation of soldering mask | |
|---|---|
| Materials | |
| Photopolymerizable compound (II) obtained in the manner described above | 50 parts |
| Methyl methacrylate/methyl acrylate/acrylic acid/acrylonitrile (83/10/2/5 by weight) copolymer (MW. approx. 120,000) | 50 parts |
| Benzophenone | 2.7 parts |
| Michler's ketone | 0.3 part |
| p-Methoxyphenol | 0.02 part |
| Victoria Pure Blue | 0.05 part |
| Toluene | 50 parts |
| Methyl ethyl ketone | 50 parts |

Benzotriazole and PHOSMER-M (a phosphate compound containing a methacryl group mfd. by Yushi Seihin Co., Ltd.) were added in amounts shown in Table 3 to 20 parts of the blend of the above-shown composition to prepare 10 solutions of photosensitive resin compositions.

TABLE 3

| Run No. | Amount of benzotriazole added (part) | Amount of PHOSMER-M added (part) |
|---|---|---|
| EX-11 | 0 | 0 |
| EX-12 | 0.005 | 0 |
| EX-13 | 0.020 | 0 |
| EX-14 | 0.100 | 0 |
| EX-15 | 0 | 0.005 |
| EX-16 | 0 | 0.020 |
| EX-17 | 0 | 0.100 |
| EX-18 | 0.003 | 0.020 |
| EX-19 | 0.010 | 0.010 |

TABLE 3-continued

| Run No. | Amount of benzo-triazole added (part) | Amount of PHOSMER-M added (part) |
|---|---|---|
| EX-20 | 0.010 | 0.005 |

(Note)
Figures are added amount in part to 20 parts of the blend of the above-shown composition.

By using these 10 solutions of photosensitive resin compositions, there were produced the photosensitive elements and further the soldering masks were formed in the same way as Example 1, and they were subjected to the same soldering test as conducted in Example 1. The results are collectively shown in Table 4.

TABLE 4

| Run No. | Condition of protective film |
|---|---|
| EX-11 | Poor as floating and peel-off occurred |
| EX-12 | " |
| EX-13 | " |
| EX-14 | " |
| EX-15 | " |
| EX-16 | " |
| EX-17 | " |
| EX-18 | Good |
| EX-19 | Good |
| EX-20 | Good |

As seen from Table 4, only the protective films formed from the photosensitive elements containing both benzotriazole and PHOSMER-M (EX-18, EX-19 and EX-20) showed good soldering heat resistance, while the protective films formed from other photosensitive elements, that is, the element containing neither benzotriazole nor PHOSMER-M (EX-11), the elements containing benzotriazole but not containing PHOSMER-M (EX-12, EX-13 and EX-14) and the elements containing PHOSMER-M but not containing benzotriazole (EX-15, EX-16 and EX-17), suffered excess floating or peel-off in said soldering test, and also solder penetrating was seen in these protective films.

EXAMPLE 5

| Materials | |
|---|---|
| Photopolymerizable compound (II) having terminal ethylene group synthesized in Example 4-(a) | 40 parts |
| ARONIX M-8060 (a polyvalent acrylate mfd. by Toagosei Chemical Industry Co., Ltd.) | 12 parts |
| Methyl methacrylate/ethyl acrylate/ tetrahydrofurfuryl methacrylate/ tribromophenyl acrylate (60/4/10/26 by weight) copolymer (MW. about 100,000) | 48 parts |
| Benzophenone | 4 parts |
| Michler's ketone | 0.2 part |
| Benzimidazole | 0.1 part |
| KAYAMER-PA2 (a phosphate compound containing an acryl group mfd. by Nippon Kayaku Co., Ltd.) | 0.2 part |
| Phthalocyanine Green SAX (a pigment mfd. by Sanyo Shikiso K.K.) | 0.3 part |
| Antimony trioxide | 1 part |
| Methyl ethyl ketone | 60 parts |
| Toluene | 50 parts |

A solution of the photosensitive resin composition containing the above-shown materials was uniformly applied on a 25 μm thick polyethylene terephthalate film by using the apparatus shown in FIG. 3 and then dried by passing through a 80°–100° C. hot air convection dryer for about 12 minutes. The photosensitive resin composition layer formed after drying had a thickness of about 90 μm. On this photosensitive resin composition layer was further pasted an about 25 μm thick polyethylene film 17 as cover film as shown in FIG. 3. The thus obtained photosensitive element was heat laminated under pressure, while stripping off the cover film, on a test printed wiring board (with a glass epoxy substrate having a thickness of 1.6 mm) having formed thereon a copper pattern (with a copper buildup of about 70 μm) shown in FIG. 5, by using a vacuum laminator mfd. by Hitachi Chemical Co., Ltd., (a degree of vacuum: 30 mm Hg, laminating temperature: 100° C., laminating speed: 1 m/min). In FIG. 5, reference numeral 1 denotes the copper pattern portion and 2 the exposed portion of the substrate, and the unit of the figures is mm. The laminate was allowed to stand at room temperature for 3 hours and then irradiated with ultraviolet rays at an exposure of 150 mJ/cm$^2$ through a test negative mask shown in FIG. 4. After additional 30-minute standing at room temperature, the support film was stripped off and the laminate was spray-developed at 20° C. for 150 seconds by using 1,1,1-trichloroethane. After the development, the laminate was dried with heating at 80° C. for 10 minutes, again irradiated with ultraviolet rays to effect 3 J/cm$^2$ exposure and further subjected to a heat treatment at 150° C. for 30 minutes. The thus obtained test substrate formed with a protective film was subjected to the soldering test by contacting it for 15 seconds with a 255°–265° C. flow soldering bath using a rosin type flux MH-320 V (mfd. by Tamura Kaken Co., Ltd.). No floating nor peel-off of the protective film occured, indicating excellent soldering heat resistance of this substrate.

COMPARATIVE EXAMPLE 2

The process of Example 5 was repeated except for not adding KAYAMER-PA2, a photosensitive element was produced. Then this element was laminated on a test substrate and an image-like protective film was formed thereon, and the thus obtained substrate was subjected to the same soldering test as in Example 5. Floating and blistering of the protective film occured, and also solder penetrating took place.

EXAMPLE 6

| Materials | |
|---|---|
| ARONIX M-6100 (a polyvalent acrylate mfd. by Toagosei Chemical Industry Co., Ltd.) | 15 parts |
| MECHPP (a monovalent methacrylate mfd. by Osaka Yuki K.K.) | 5 parts |
| A-TMM-3L (a polyvalent acrylate mfd. by Shin-Nakamura Kagaku K.K.) | 20 parts |
| Methyl methacrylate/ethyl acrylate/ styrene/methacrylic acid/tribromophenyl acrylate (35/20/10/25/10 by weight) copolymer (MW. about 80,000) | 60 parts |
| Benzophenone | 4 parts |
| Michler's ketone | 0.2 part |
| Benzotriazole hydrochloride | 0.05 part |
| PHOSMER-CL (a phosphate compound containing a methacryl group mfd. by Yushi Seihin Co., Ltd.) | 0.1 part |
| Victoria Pure Blue | 0.01 part |
| Antimony trioxide | 1 part |
| Ethyl cellosolve | 80 parts |
| Methyl ethyl ketone | 40 parts |

By using a solution of the photosensitive resin composition of the above-shown recipe, there was produced a photosensitive element having an approximately 60 μm thick photosensitive resin composition layer in the same way as Example 5. This photosensitive element was heat laminated under reduced pressure (a degree of vacuum: 20 mm Hg), while stripping off the cover film, on a test printed wiring board (with a glass epoxy substrate having a thickness of 0.8 mm) formed with a copper pattern (with a copper buildup of about 35 μm) shown in FIG. 5. After standing at room temperature for 24 hours, the laminate was irradiated with ultraviolet rays at an exposure of 150 mJ/cm² through a test negative mask shown in FIG. 4. After additional 30-minute standing at room temperature, the support film was stripped off and the laminate was developed by spraying a 2% aqueous solution of sodium carbonate of 35° C. for 70 seconds.

After washing with water, the laminate was dried with heating at 80° C. for 20 minutes, then irradiated with ultraviolet rays at an exposure rate of 3 J/cm² and further subjected to a 40-minutes heat treatment at 160° C.

The thus obtained test substrate formed with a protective film was subjected to the soldering test by contacting it for 15 seconds with a 255°–265° C. flow soldering bath by using a water-soluble flux WX-37 (mfd. by Tamura Kaken Co., Ltd.). This substrate caused no floating nor peel-off of the protective film and exhibited excellent soldering heat resistance.

As explained in detail in the Examples, it is quite surprising that the soldering heat resistance is amazingly improved only when using in combination two different types of components (a) and (b) which, when used independently, show no noticeable effect even if the blended amount is increased. The photosensitive resin composition and the photosensitive element according to this invention can form a protective film with excellent adhesiveness to the substrate surface, and the formed protective film is suited for use as a resist for soldering mask, etc.

What is claimed is:

1. A photosensitive resin composition for the preparation of a solder resist comprising:
   (a) at least one compound selected from the group consisting of benzotriazole, benzimidazole, benzothiazole, derivatives thereof and and salts thereof, the derivatives of benzotriazole, benzimidazole, and benzothiazole being those obtained by substituting one or more hydrogen atoms in said compounds with one or more alkyl groups, aryl groups, nitro groups, amino groups, hydroxyl groups, carboxyl groups or halogens,
   (b) an unsaturated organic phosphate compound having photopolymerizable ethylenically unsaturated bonds selected from the group consisting of acid phosphoxyethyl methacrylate, 3-chloro-2-acid phosphoxypropyl methacrylate, bis(methacryloxyethyl)phosphate, acryloxyethyl phosphate, bis(acryloxyethyl)phosphate, bis(2-chloroethyl)vinyl phosphate and 1,2-bis(carboxyallyl)ethyldibutyl phosphate,
   (c) 20 to 40 parts by weight of a vinyl copolymer,
   (d) 20 to 80 parts by weight of a photopolymerizable unsaturated compound having at least one terminal ethylene group, and
   (e) 0.5 to 10 parts by weight of a sensitizer and/or a sensitizer system other than component (a) capable of initiating polymerization of components (b) and (d) upon irradiation of actinic light; the amount of component (a) being about 0.001% by weight or more and the amount of component (b) being about 0.001% by weight or more based on the weight of the photosensitive resin composition.

2. A composition according to claim 1, wherein the salts of benzotriazole, benzimidazole and benzothiazole are acid salts or amine salts of said compounds.

3. A composition according to claim 1, wherein the photopolymerizable unsaturated compound having at least one terminal ethylene group of component (d) is an urethane diacrylate or urethane dimethacrylate compound obtained by reacting:
   (i) at least one diisocyanate compound selected from the group consisting of trimethylhexamethylene diisocyanate and isophorone diisocyanate,
   (ii) an acrylic or methacrylic monoester of a dihydric alcohol, and
   (iii) a dihydric alcohol.

4. A composition according to claim 1, wherein the component (a) is hydroxybenzotriazole and the component (b) is acid phosphoxyethyl methacrylate.

5. A composition according to claim 1, wherein the component (a) is benzimidazole and the component (b) is bis(acryloxyethyl)phosphate.

6. A composition according to claim 1, wherein the component (a) is benzotriazole hydrochloride and the component (b) is 3-chloro-2-acid phosphoxypropyl methacrylate.

7. A photosensitive element for the preparation of a solder resist comprising a layer of a photosensitive resin composition comprising:
   (a) at least one compound selected from the group consisting of benzotriazole, benzimidazole, benzothiazole, derivatives thereof and salts thereof, the derivatives of benzotriazole, benzimidazole, and benzothiazole being those obtained by substituting one or more hydrogen atoms in said compounds with one or more alkyl groups, aryl groups, nitro groups, amino groups, hydroxyl groups, carboxyl groups or halogens,
   (b) an unsaturated organic phosphate compound having photopolymerizable ethylenically unsaturated bonds selected from the group consisting of acid phosphoxyethyl methacrylate, 3-chloro-2-acid phosphoxypropyl methacrylate, bis(acryloxyethyl)phosphate, bis(2-chloroethyl)vinyl phosphate and 1,2-bis(carboxyallyl)ethyldibutyl phosphate,
   (c) 20 to 40 parts by weight of a vinyl copolymer,
   (d) 20 to 80 parts by weight of a photopolymerizable unsaturated compound having at least one terminal ethylene group, and
   (e) 0.5 to 10 parts by weight of a sensitizer and/or a sensitizer system other than component (a) capable of initiating polymerization of components (b) and (d) upon irradiation of actinic light; the amount of component (a) being about 0.001% by weight or more and the amount of component (b) being about 0.001% by weight or more based on the weight of the photosensitive resin composition, and a support film supporting said layer.

8. A photosensitive element according to claim 7, wherein the salts of benzotriazole, benzimidazole and benzothiazole of the component (a) are acid salts or amine salts of said compounds.

9. A photosensitive element according to claim 7, wherein the photopolymerizable unsaturated compound having at least one terminal ethylene group of component (d) is an urethane diacrylate or urethane dimethacrylate compound obtained by reacting:
(i) at least one diisocyanate compound selected from the group consisting of trimethylhexamethylene diisocyanate and isophorone diisocyanate,
(ii) an acrylic or methacrylic monoester of a dihydric alcohol, and
(iii) a dihydric alcohol.

10. A photosensitive element according to claim 7, wherein the component (a) is hydroxybenzotriazole and the component (b) is acid phosphoxyethyl methacrylate.

11. A photosensitive element according to claim 7, wherein the component (a) is benzimidazole and the component (b) is bis(acryloxyethyl)phosphate.

12. A photosensitive element according to claim 7, wherein the component (a) is benzotriazole hydrochloride and the component (b) is 3-chloro-2-acid phospoxypropyl methacrylate.

13. A photosensitive element according to claim 7, wherein said sensitizer is at least one compound selected from the group consisting of 2-ethylanthraquinone, 2-t-butylanthraquinone, octamethylanthraquinone, 1,2-benzanthraquinone, 2,3-diphenylanthraquinone, diacetyl, benzyl, benzoin, pivalone, α-phenyl-benzoin, α,α-diethoxyacetophenone, benzophenone, and 4,4'-bis-dialkylaminobenzophenone, and the sensitizer system comprises combinations of a 2,4,5-triarylimidazole dimer and 2-mercaptobenzoquinazole, leucocrystal violet, and tris(4-diethylamino-2-methylphenyl)methane or triethanolamine in combination with benzophenone.

14. A photosensitive resin composition according to claim 1, wherein said sensitizer is at least one compound selected from the group consisting of 2-ethylanthraquinone, 2-t-butylanthraquinone, octamethylanthraquinone, 1,2-benzanthraquinone, 2,3-diphenylanthraquinone, diacetyl, benzyl, benzoin, pivalone, α-phenyl-benzoin, α,α-diethoxyacetophenone, benzophenone, and 4,4'-bisdialkylaminobenzophenone, and the sensitizer system comprises combinations of a 2,4,5-triarylimidazole dimer and 2-mercaptobenzoquinazole, leucocrystal violet, and tris(4-diethylamino-2-methylphenyl)methane or triethanolamine in combination with benzophenone.

* * * * *